United States Patent
Stark

(10) Patent No.: US 9,046,582 B1
(45) Date of Patent: Jun. 2, 2015

(54) SYSTEM AND METHOD FOR TESTING A BATTERY

(75) Inventor: Dana P. Stark, North Billerica, MA (US)

(73) Assignee: EMC Corporation, Hopkinton, MA (US)

(*) Notice: Subject to any disclaimer, the term of this patent is extended or adjusted under 35 U.S.C. 154(b) by 979 days.

(21) Appl. No.: 12/638,262

(22) Filed: Dec. 15, 2009

(51) Int. Cl.
*G06F 1/26* (2006.01)
*G06F 1/30* (2006.01)
*G01R 31/36* (2006.01)
*H02J 9/04* (2006.01)

(52) U.S. Cl.
CPC .............. *G01R 31/3631* (2013.01); *G06F 1/26* (2013.01)

(58) Field of Classification Search
CPC ... G01R 31/3631; G01R 31/3693; H02J 9/04; G06F 1/30; G06F 1/263
USPC .......... 713/340; 324/415, 426, 436, 526, 537, 324/750.01; 320/127
See application file for complete search history.

(56) References Cited

U.S. PATENT DOCUMENTS

| | | | | |
|---|---|---|---|---|
| 5,583,440 | A * | 12/1996 | Bisher | 324/426 |
| 6,211,681 | B1 * | 4/2001 | Kagawa et al. | 324/426 |
| 6,356,057 | B1 * | 3/2002 | Shilo et al. | 320/127 |
| 2001/0017485 | A1 * | 8/2001 | Yoo | 307/66 |
| 2001/0017531 | A1 * | 8/2001 | Sakakibara et al. | 320/106 |
| 2007/0080692 | A1 * | 4/2007 | Evans | 324/426 |
| 2008/0164762 | A1 * | 7/2008 | Pecile | 307/66 |
| 2009/0237086 | A1 * | 9/2009 | Andelfinger | 324/431 |

* cited by examiner

*Primary Examiner* — Paul Yanchus, III
*Assistant Examiner* — Brandon Kinsey
(74) *Attorney, Agent, or Firm* — Brian J. Colandreo; Mark H. Whittenberger; Holland & Knight LLP

(57) ABSTRACT

A method, computer program product, and computing system for decoupling a cooling fan within a computing device from a line voltage power supply. The cooling fan within the computing device is coupled to a battery backup unit. The cooling fan is energized for a defined test period. One or more battery statistics are monitored during at least a portion of the defined test period.

21 Claims, 4 Drawing Sheets

SYSTEM AND METHOD FOR TESTING A BATTERY

TECHNICAL FIELD

This disclosure relates to battery testing and, more particularly, to the testing of batteries with a battery backup unit.

BACKGROUND

Battery backup units are often utilized when a high level of availability is required for an electronic component. Unfortunately, the reliability of the battery backup unit is only as reliable as the battery included within the battery backup unit. Accordingly, it is prudent to regularly check such batteries. Unfortunately, the checking of such batteries is often reduced to a relatively quick bleed-down test is which a load is placed across the battery for a few seconds and various battery criteria are measured. While this test may provide some level of assurance concerning the viability of the battery, the test may be too short to discern any meaningful data.

SUMMARY OF DISCLOSURE

In one implementation, a method of testing a battery backup unit includes decoupling a cooling fan within a computing device from a line voltage power supply. The cooling fan within the computing device is coupled to a battery backup unit. The cooling fan is energized for a defined test period. One or more battery statistics are monitored during at least a portion of the defined test period.

One or more of the following features may be included. A first delay may be introduced between decoupling the cooling fan within the computing device from the line voltage power supply and coupling the cooling fan within the computing device to the battery backup unit. The first delay may be at least thirty milliseconds. The cooling fan within the computing device may be decoupled from the battery backup unit and the cooling fan within the computing device may be recoupled to the line voltage power supply. A second delay may be introduced between decoupling the cooling fan within the computing device from the battery backup unit and recoupling the cooling fan within the computing device to the line voltage power supply. The second delay may be at least thirty milliseconds. The battery statistics may be chosen from the group consisting of: voltage drop, current draw, and battery temperature.

In another implementation of this disclosure, a computer program product resides on a computer readable medium and has a plurality of instructions stored on it. When executed by a processor, the instructions cause the processor to perform operations including decoupling a cooling fan within a computing device from a line voltage power supply. The cooling fan within the computing device is coupled to a battery backup unit. The cooling fan is energized for a defined test period. One or more battery statistics are monitored during at least a portion of the defined test period.

One or more of the following features may be included. A first delay may be introduced between decoupling the cooling fan within the computing device from the line voltage power supply and coupling the cooling fan within the computing device to the battery backup unit. The first delay may be at least thirty milliseconds. The cooling fan within the computing device may be decoupled from the battery backup unit and the cooling fan within the computing device may be recoupled to the line voltage power supply. A second delay may be introduced between decoupling the cooling fan within the computing device from the battery backup unit and recoupling the cooling fan within the computing device to the line voltage power supply. The second delay may be at least thirty milliseconds. The battery statistics may be chosen from the group consisting of: voltage drop, current draw, and battery temperature.

In another implementation, a computing system includes at least one processor, at least one memory architecture coupled with the at least one processor, a power supply switching device, and a battery backup unit switching device. A first software module is executed on the at least one processor and the at least one memory architecture. The first software module is configured to decouple, via the power supply switching device, a cooling fan within a computing device from a line voltage power supply. A second software module is executed on the at least one processor and the at least one memory architecture. The second software module is configured to couple, via the battery backup unit switching device, the cooling fan within the computing device to a battery backup unit. A third software module is executed on the at least one processor and the at least one memory architecture. The third software module is configured to energize the cooling fan for a defined test period. A fourth software module is executed on the at least one processor and the at least one memory architecture. The fourth software module is configured to monitor one or more battery statistics during at least a portion of the defined test period.

One or more of the following features may be included. A first delay may be introduced between decoupling the cooling fan within the computing device from the line voltage power supply and coupling the cooling fan within the computing device to the battery backup unit. The first delay may be at least thirty milliseconds. The cooling fan within the computing device may be decoupled from the battery backup unit and the cooling fan within the computing device may be recoupled to the line voltage power supply. A second delay may be introduced between decoupling the cooling fan within the computing device from the battery backup unit and recoupling the cooling fan within the computing device to the line voltage power supply. The second delay may be at least thirty milliseconds. The battery statistics may be chosen from the group consisting of: voltage drop, current draw, and battery temperature.

The details of one or more implementations are set forth in the accompanying drawings and the description below. Other features and advantages will become apparent from the description, the drawings, and the claims.

DETAILED DESCRIPTION OF THE PREFERRED EMBODIMENTS

System Overview

Figure 1:
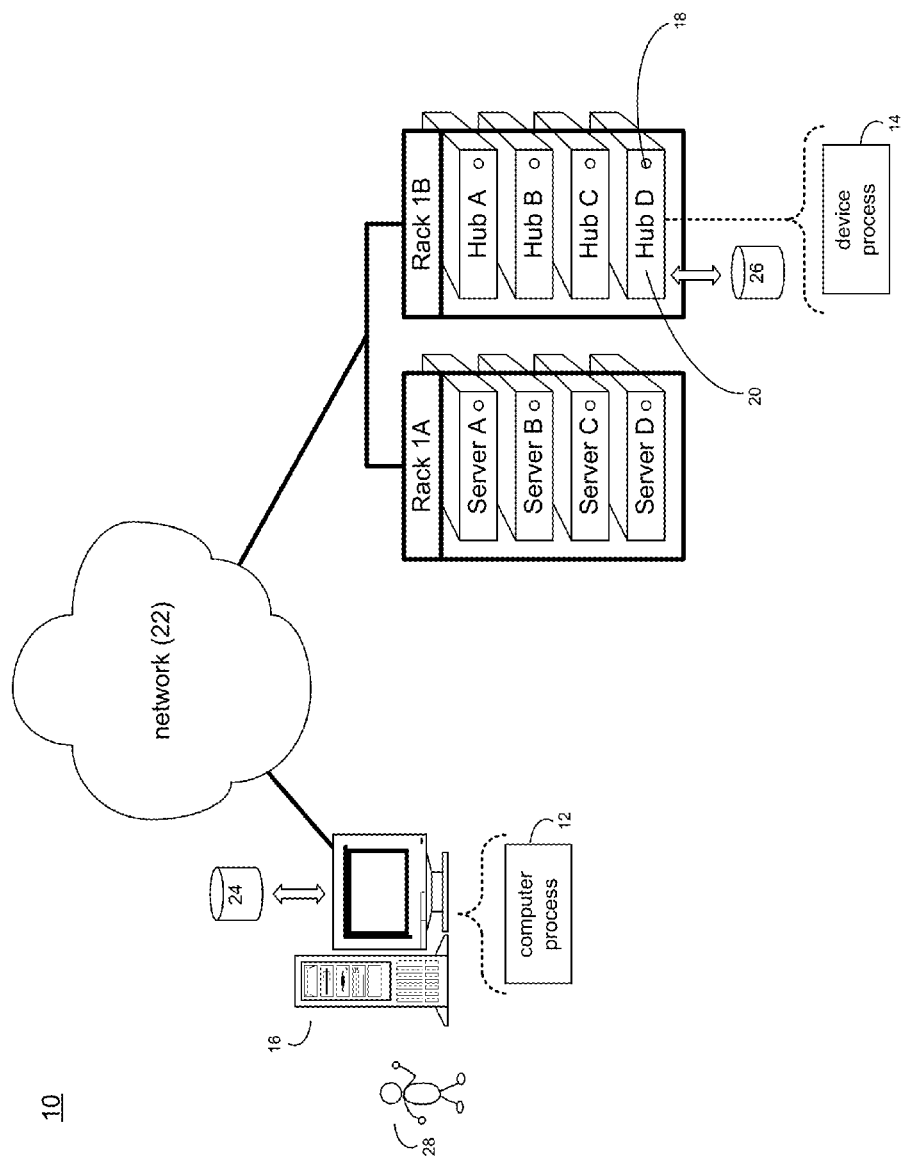
FIG. 1 is a diagrammatic view of a testing process executed in whole or in part by a device coupled to a distributed computing network.
Figure 2:
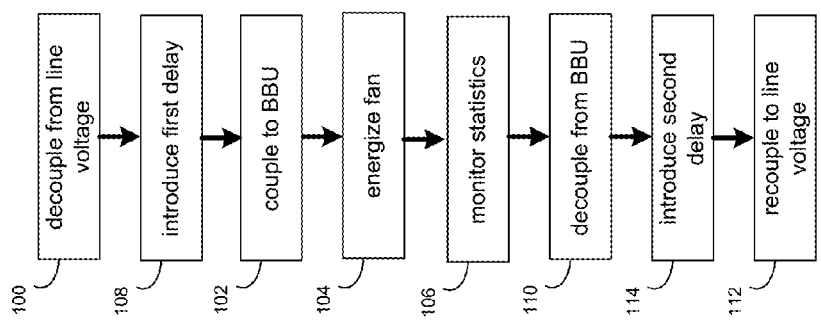
FIG. 2 is a flowchart of the testing process of FIG. 1.

Referring to FIGS. 1 & 2, there is shown testing process 10. Testing process 10 may include one or more of computer process 12 and device process 14. Accordingly and for the following discussion, the testing process will be described generally as testing process 10, with the understanding that testing process 10 may include one or more of computer process 12 and device process 14.

Computer process 12 may be executed (in whole or in part) by computer 16 (e.g., a single server computer, a plurality of server computers, a general purpose computer, a laptop computer, or a notebook computer). Device process 14 may be executed (in whole or in part) by embedded device 18. Embedded device 18 may be incorporated into, coupled with, or a portion of computing device 20, examples of which may include but are not limited to a server, a bridge, a router, a brouter, a switch, a gateway, a hub, a protocol convertor, a proxy device, a firewall, a network address translator, a multiplexor, a modem, a repeater, a storage module, and a power supply module. Examples of embedded device 18 may include but are not limited to a microprocessor and memory, an embedded controller, a single board computer, a programmable logic controller, and/or a portion of computing device 20.

As will be discussed below in greater detail, device location process 10 may decouple 100 a cooling fan within the computing device (e.g., computing device 20) from a line voltage power supply (e.g., a 120 VAC power supply included within the computing device 20). The cooling fan within the computing device may be coupled 102 to a battery backup unit (e.g., a low voltage battery system included within computing device 20). The cooling fan may be energized 104 for a defined test period and one or more battery statistics may be monitored 106 during at least a portion of the defined test period.

Computer 16 may be coupled to network 22 (e.g., the Internet, an intranet, a local area network, a wide area network, and/or an extranet). Computer 16 may execute an operating system, examples of which may include but are not limited to Microsoft Windows Vista™, or Redhat Linux™.

The instruction sets and subroutines of computer process 12 (which may be grouped to form one or more software modules), which may be stored on a storage device 24 coupled to computer 16, may be executed by one or more processors (not shown) and one or more memory architectures (not shown) incorporated into computer 16. Storage device 24 may include but is not limited to a hard disk drive, a tape drive, an optical drive, a RAID array, a random access memory (RAM), or a read-only memory (ROM).

The instruction sets and subroutines of device process 16 (which may be grouped to form one or more software modules), which may be stored on storage device 26 coupled to the computing device (e.g., computing device 20), may be executed by one or more processors (not shown) and one or more memory architectures (not shown) incorporated into the computing device (e.g., computing device 20). Storage device 26 may include but is not limited to a hard disk drive, a tape drive, an optical drive, a RAID array, a random access memory (RAM), a read-only memory (ROM), or a flash memory device.

While computer 16 is shown hardwired to network 22, this is for illustrative purposes only and is not intended to be a limitation of this disclosure, as other configurations are possible and are considered to be within the scope of this disclosure. For example, computer 16 may be wirelessly coupled to network 22 via e.g., a wireless communication channel (not shown) established between computer 16 and a wireless access point (not shown), which may be directly coupled to network 22.

While computing device 20 is shown hardwired to network 22, this is for illustrative purposes only and is not intended to be a limitation of this disclosure, as other configurations are possible and are considered to be within the scope of this disclosure. For example, computing device 20 may be wirelessly coupled to network 22 via e.g., a wireless communication channel (not shown) established between computing device 20 and a wireless access point (not shown), which may be directly coupled to network 22.

The Testing Process:

As discussed above, testing process 10 may decouple 100 a cooling fan within the computing device (e.g., computing device 20) from a line voltage power supply (e.g., a 120 VAC power supply included within the computing device 20). The cooling fan within the computing device may be coupled 102 to a battery backup unit (e.g., a low voltage battery system included within computing device 20). The cooling fan may be energized 104 for a defined test period and one or more battery statistics may be monitored 106 during at least a portion of the defined test period.

Figure 3:
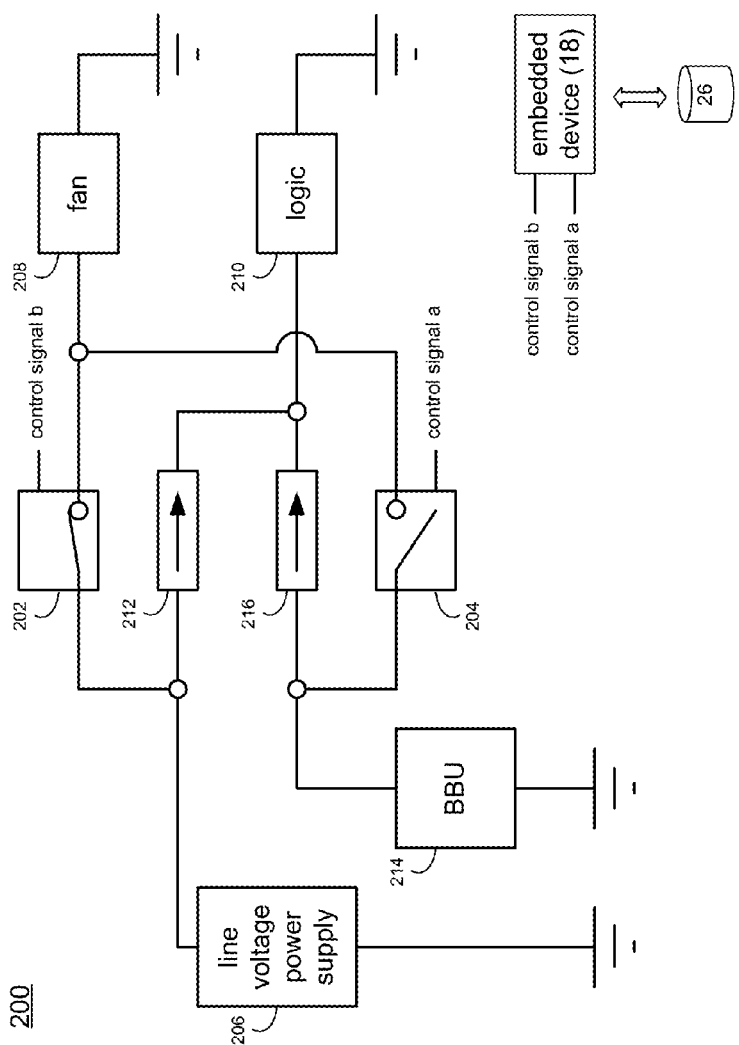
FIG. 3 is a diagrammatic view of a device that executes the testing process of FIG. 1 and the circuit being controlled by the testing process of FIG. 1.

Referring also to FIG. 3, there is shown a block diagram of an exemplary implementation of testing process 10 and the various switches being controlled by testing process 10. During normal operation (i.e., non-testing mode) of circuit 200, switch assembly 202 is normally closed and switch assembly 204 is normally open. Therefore, during normal operation, electrical power from line voltage power supply 206 is provided to cooling fan 208 through switch assembly 202. Examples of switch assemblies 202, 204 may include but are not limited to relays, electrically-actuated switches and/or various transistor circuits.

Assume for illustrative purposes only that user 28 wishes to test battery backup unit 214 included within computing device 20. User 28 may initiate testing process 10 via computing process 12. As discussed above, computing process 12 (which may be executed on computer 16) may interface with device process 14 (which is executed on embedded device 18) via e.g., network 22. Alternatively, testing process 10 may be initiated using computing device 20 if the appropriate interface (not shown) is included within computing device 20.

Once testing mode is initiated, testing process 10 may send a control signal (e.g., control signal b) to switch assembly 202, instructing switch assembly 202 to open, resulting in cooling fan 208 being decoupled 100 from line voltage power supply 206. Further, testing process 10 may send a control signal (e.g., control signal a) to switch assembly 204, instructing switch assembly 204 to close, resulting in cooling fan 208 being coupled 102 to battery backup unit 214. Therefore, when testing battery backup unit 214, electrical power from battery backup unit 214 is provided to cooling fan 208 through switch assembly 204.

Regardless of the operating mode (e.g., normal or test), electrical power from line voltage power supply 206 and battery backup unit 214 is provided to logic 210 through mono-directional flow controller 212 and mono-directional flow controller 216 (respectively), thus providing a high level of availability in the event of a power failure, as battery backup unit 214 will provide power to logic 210 while line voltage power supply 206 is unavailable.

Examples of mono-directional flow controllers 212, 216 may include but are not limited to one or more diodes and/or various transistor circuits. Examples of logic 210 may include but are not limited to logic that executes all or a portion of the functionality of computing device 20. As discussed above, examples of computing device 20 may include but are not limited to a server, a bridge, a router, a brouter, a switch, a gateway, a hub, a protocol convertor, a proxy device, a firewall, a network address translator, a multiplexor, a modem, a repeater, a storage module, and a power supply module.

A first delay may be introduced 108 between decoupling 100 cooling fan 208 from line voltage power supply 206 and coupling 102 cooling fan 208 to battery backup unit 214. A typical value for this first delay is greater than thirty milliseconds. This delay may be accomplished (via process 10) by defining the delay between providing control signal b and providing control signal a. Alternatively, components (e.g., an RC circuit) may be included within one or more of switch assemblies 202, 204 that may be set (via an RC time constant) that may accomplish the required first delay.

Once in test mode, cooling fan 208 may be energized 104 for a defined test period (e.g., five minutes) so that one or more battery statistics may be monitored 106 during at least a portion of the defined test period. Examples of the battery statistics monitored 106 may include but are not limited to voltage drop across battery backup unit, current draw pulled from battery backup unit, and battery temperature.

Once test mode is completed, test process 10 may make a determination concerning the viability of battery backup unit 214. The determination may be as simple as providing a simple pass/fail score. Alternatively, some or all of the battery statistics monitored 106 may be provided to user 28.

Additionally, once test mode is completed, testing process 10 may send a control signal (e.g., control signal a to switch assembly 204, instructing switch assembly 204 to open, resulting in cooling fan 208 being decoupled 110 from battery backup unit 214. Further, testing process 10 may send a control signal (e.g., control signal b) to switch assembly 202, instructing switch assembly 202 to close, resulting in cooling fan 208 being recoupled 112 to line voltage power supply 206.

A second delay may be introduced 114 between decoupling 110 cooling fan 208 from battery backup unit 214 and recoupling 112 cooling fan 208 to line voltage power supply 206. A typical value for this second delay is greater than thirty milliseconds. This delay may be accomplished (via process 10) by defining the delay between providing control signal a and providing control signal b. Alternatively, components (e.g., an RC circuit) may be included within one or more of switch assemblies 202, 204 that may be set (via an RC time constant) that may accomplish the required second delay.

Figure 4:
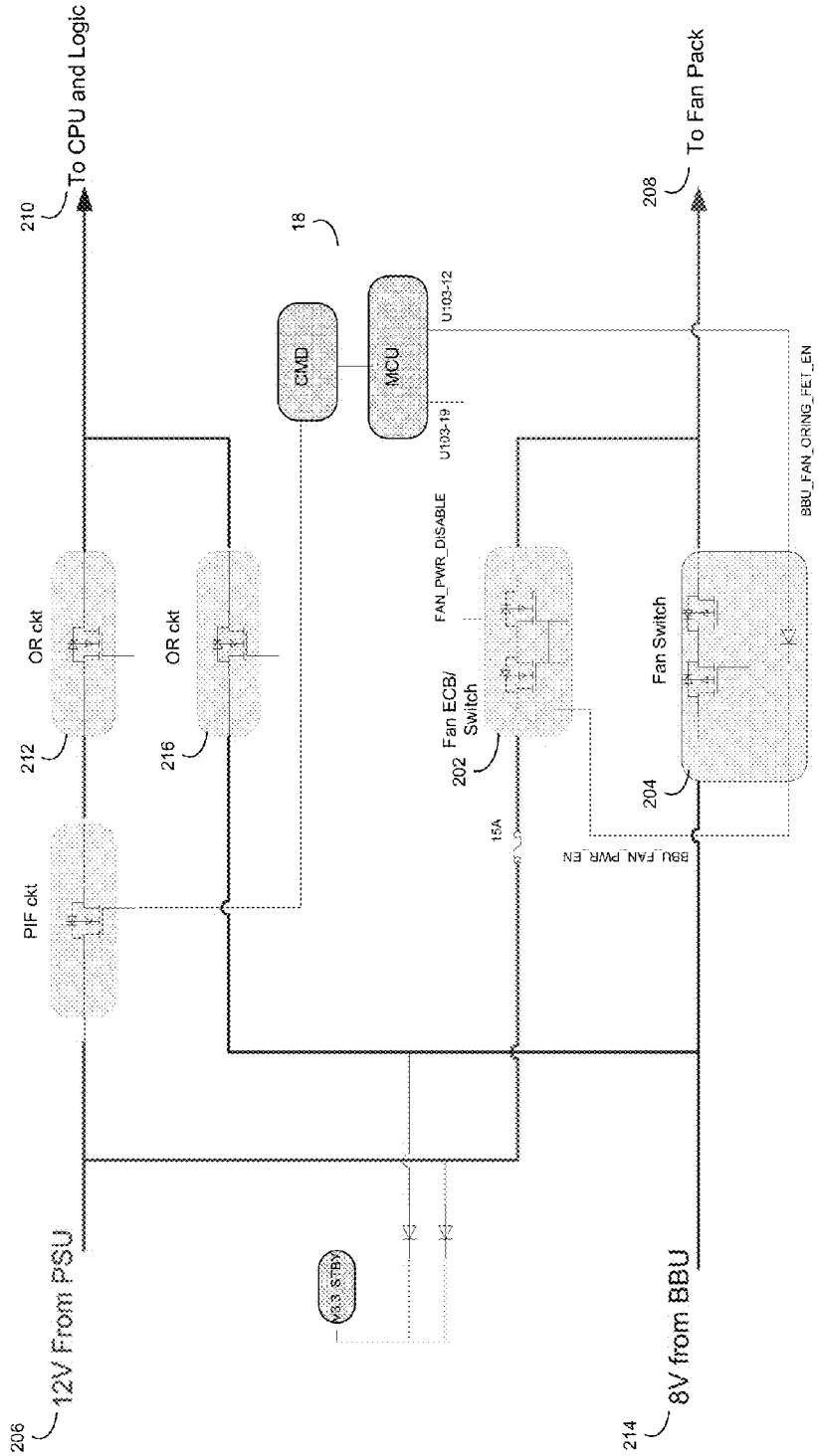
FIG. 4 is a more-detailed diagrammatic view of a device that executes the testing process of FIG. 1 and the circuit being controlled by the testing process of FIG. 1.

Referring to FIG. 4, there is shown a more-detailed block diagram of an exemplary implementation of testing process 10 and the various switches being controlled by testing process 10. Specifically, in this exemplary implementation, switch assemblies 202, 204 and mono-directional flow controllers 212, 216 are illustrated as being constructed from discrete transistors.

A number of implementations have been described. Nevertheless, it will be understood that various modifications may be made. Accordingly, other implementations are within the scope of the following claims.

What is claimed is:

1. A method of testing a battery backup unit comprising:
   decoupling a cooling fan within a computing device from a line voltage power supply;
   coupling the cooling fan within the computing device to a battery backup unit, wherein a first delay is introduced between decoupling the cooling fan within the computing device from a line voltage power supply and coupling the cooling fan within the computing device to the battery backup unit, wherein the first delay is defined by a delay between providing a first control signal and providing a second control signal;
   energizing the cooling fan for a defined test period, wherein the defined test period is a predefined period of time; and
   monitoring one or more battery statistics during at least a portion of the defined test period.

2. The method of claim 1 wherein the first delay is at least thirty milliseconds.

3. The method of claim 1 further comprising:
   decoupling the cooling fan within the computing device from the battery backup unit; and
   recoupling the cooling fan within the computing device to the line voltage power supply.

4. The method of claim 3 further comprising:
   introducing a second delay between decoupling the cooling fan within the computing device from the battery backup unit and recoupling the cooling fan within the computing device to the line voltage power supply.

5. The method of claim 4 wherein the second delay is at least thirty milliseconds.

6. The method of claim 1 wherein the battery statistics are chosen from the group consisting of: voltage drop and current draw.

7. A computer program product residing on a non-transitory computer readable medium having a plurality of instructions stored thereon that, when executed by a processor, cause the processor to perform operations comprising:
   decoupling a cooling fan within a computing device from a line voltage power supply;
   coupling the cooling fan within the computing device to a battery backup unit, wherein a first delay is introduced between decoupling the cooling fan within the computing device from a line voltage power supply and coupling the cooling fan within the computing device to the battery backup unit, wherein the first delay is defined by a delay between providing a first control signal and providing a second control signal;
   energizing the cooling fan for a defined test period, wherein the defined test period is a predefined period of time; and
   monitoring one or more battery statistics during at least a portion of the defined test period.

8. The computer program product of claim 7 wherein the first delay is at least thirty milliseconds.

9. The computer program product of claim 7 further comprising instructions for:
   decoupling the cooling fan within the computing device from the battery backup unit; and
   recoupling the cooling fan within the computing device to the line voltage power supply.

10. The computer program product of claim 9 further comprising instructions for:
    introducing a second delay between decoupling the cooling fan within the computing device from the battery backup unit and recoupling the cooling fan within the computing device to the line voltage power supply.

11. The computer program product of claim 10 wherein the second delay is at least thirty milliseconds.

12. The computer program product of claim 7 wherein the battery statistics are chosen from the group consisting of: voltage drop and current draw.

13. A computing system comprising:
    at least one processor;
    at least one memory architecture coupled with the at least one processor;
    a power supply switching device;
    a battery backup unit switching device;

a first software module executed on the at least one processor and the at least one memory architecture, wherein the first software module is configured to decouple, via the power supply switching device, a cooling fan within a computing device from a line voltage power supply;

a second software module executed on the at least one processor and the at least one memory architecture, wherein the second software module is configured to couple, via the battery backup unit switching device, the cooling fan within the computing device to a battery backup unit, wherein the battery backup unit switching device is configured to introduce a first delay between decoupling the cooling fan within the computing device from a line voltage power supply and coupling the cooling fan within the computing device to the battery backup unit wherein the first delay is defined by a delay between providing a first control signal and providing a second control signal;

a third software module executed on the at least one processor and the at least one memory architecture, wherein the third software module is configured to energize the cooling fan for a defined test period, wherein the defined test period is a predefined period of time; and a fourth software module executed on the at least one processor and the at least one memory architecture, wherein the fourth software module is configured to monitor one or more battery statistics during at least a portion of the defined test period.

14. The computing system of claim 13 wherein the first delay is at least thirty milliseconds.

15. The computing system of claim 13 further comprising:

a fifth software module executed on the at least one processor and the at least one memory architecture, wherein the sixth software module is configured to decouple the cooling fan within the computing device from the battery backup unit; and a sixth software module executed on the at least one processor and the at least one memory architecture, wherein the seventh software module is configured to recouple the cooling fan within the computing device to the line voltage power supply.

16. The computing system of claim 15 wherein the power supply switching device is configured to introduce a second delay between decoupling the cooling fan within the computing device from the battery backup unit and recoupling the cooling fan within the computing device to the line voltage power supply.

17. The computing system of claim 16 wherein the second delay is at least thirty milliseconds.

18. The computing system of claim 13 wherein the battery statistics are chosen from the group consisting of: voltage drop and current draw.

19. The method of claim 1 wherein the battery statistics include battery temperature.

20. The computer program product of claim 7 wherein the battery statistics include battery temperature.

21. The computing system of claim 13 wherein the battery statistics include battery temperature.

\* \* \* \* \*